(12) United States Patent
Lee (10) Patent No.: US 8,917,550 B2
(45) Date of Patent: *Dec. 23, 2014

(54) APPARATUS COMPARING VERIFIED DATA TO ORIGINAL DATA IN THE PROGRAMMING OF MEMORY CELLS

(75) Inventor: June Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/493,696

(22) Filed: Jun. 11, 2012

(65) Prior Publication Data

US 2012/0243333 A1  Sep. 27, 2012

Related U.S. Application Data (60) Division of application No. 11/700,341, filed on Jan. 31, 2007, now Pat. No. 7,738,295, and a continuation of application No. 12/816,103, filed on Jun. 15, 2010, now Pat. No. 8,199,574, which is a division of application No. 11/700,341, filed on Jan. 31, 2007, now Pat. No. 7,738,295.

(51) Int. Cl.
G11C 16/06 (2006.01)
G11C 11/34 (2006.01)
G11C 16/34 (2006.01)
G11C 16/04 (2006.01)

(52) U.S. Cl.
CPC ........ *G11C 16/3454* (2013.01); *G11C 16/0483* (2013.01); *G11C 16/3459* (2013.01)

USPC ........... 365/185.09; 365/185.03; 365/185.17; 365/185.19; 365/185.22; 365/185.24

(58) Field of Classification Search
USPC ............ 365/185.03, 185.17, 185.19, 185.22, 365/185.24, 185.28
See application file for complete search history.

(56) References Cited

U.S. PATENT DOCUMENTS

| | | | | |
|---|---|---|---|---|
| 5,774,397 | A * | 6/1998 | Endoh et al. | 365/185.19 |
| 7,006,382 | B2 | 2/2006 | Pekny et al. | |
| 7,020,017 | B2 | 3/2006 | Chen et al. | |
| 7,046,554 | B2 | 5/2006 | Lee | |
| 7,120,051 | B2 | 10/2006 | Gorobets et al. | |
| 7,142,459 | B2 | 11/2006 | Pekny et al. | |
| 7,245,528 | B2 | 7/2007 | Shibata et al. | |
| 7,420,847 | B2 * | 9/2008 | Li | 365/185.22 |
| 7,440,319 | B2 | 10/2008 | Li et al. | |
| 7,440,323 | B2 | 10/2008 | Lutze et al. | |
| 7,539,057 | B2 | 5/2009 | Hwang et al. | |
| 7,561,467 | B2 | 7/2009 | Kang et al. | |
| 8,199,574 | B2 * | 6/2012 | Lee | 365/185.09 |
| 2004/0105314 | A1 | 6/2004 | Shibata et al. | |
| 2005/0169057 | A1 * | 8/2005 | Shibata et al. | 365/185.28 |

* cited by examiner

*Primary Examiner* — Tha-O H Bui
(74) *Attorney, Agent, or Firm* — Dicke, Billig & Czaja, PLLC

(57) ABSTRACT

Apparatus configured to perform a programming operation on a row of memory cells in response to original data, configured to perform a comparison of verified data of the row of memory cells to the original data following success of the programming of the row of memory cells, and further configured to perform a post-programming program operation on the row of memory cells if the verified data is different from the original data.

20 Claims, 8 Drawing Sheets

APPARATUS COMPARING VERIFIED DATA TO ORIGINAL DATA IN THE PROGRAMMING OF MEMORY CELLS

RELATED APPLICATION

This application is a divisional of U.S. application Ser. No. 11/700,341, titled "PROGRAMMING A NON-VOLATILE MEMORY DEVICE," filed Jan. 31, 2007, (now U.S. Pat. No. 7,738,295, issued on Jun. 15, 2010) and is further a Continuation of U.S. application Ser. No. 12/816,103, titled "APPARATUS COMPARING VERIFIED DATA TO ORIGINAL DATA IN THE PROGRAMMING OF A MEMORY ARRAY," filed Jun. 15, 2010, now U.S. Pat. No. 8,199,574, issued on Jun. 12, 2012, which is a Divisional of U.S. application Ser. No. 11/700,341, titled "PROGRAMMING A NON-VOLATILE MEMORY DEVICE," filed Jan. 31, 2007, (now U.S. Pat. No. 7,738,295, issued on Jun. 15, 2010) each of which is commonly assigned and incorporated in its entirety herein by reference.

TECHNICAL FIELD

The present embodiments relate generally to memory devices and particularly to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. Generally, these can be considered either volatile or non-volatile memory.

Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Figure 1:
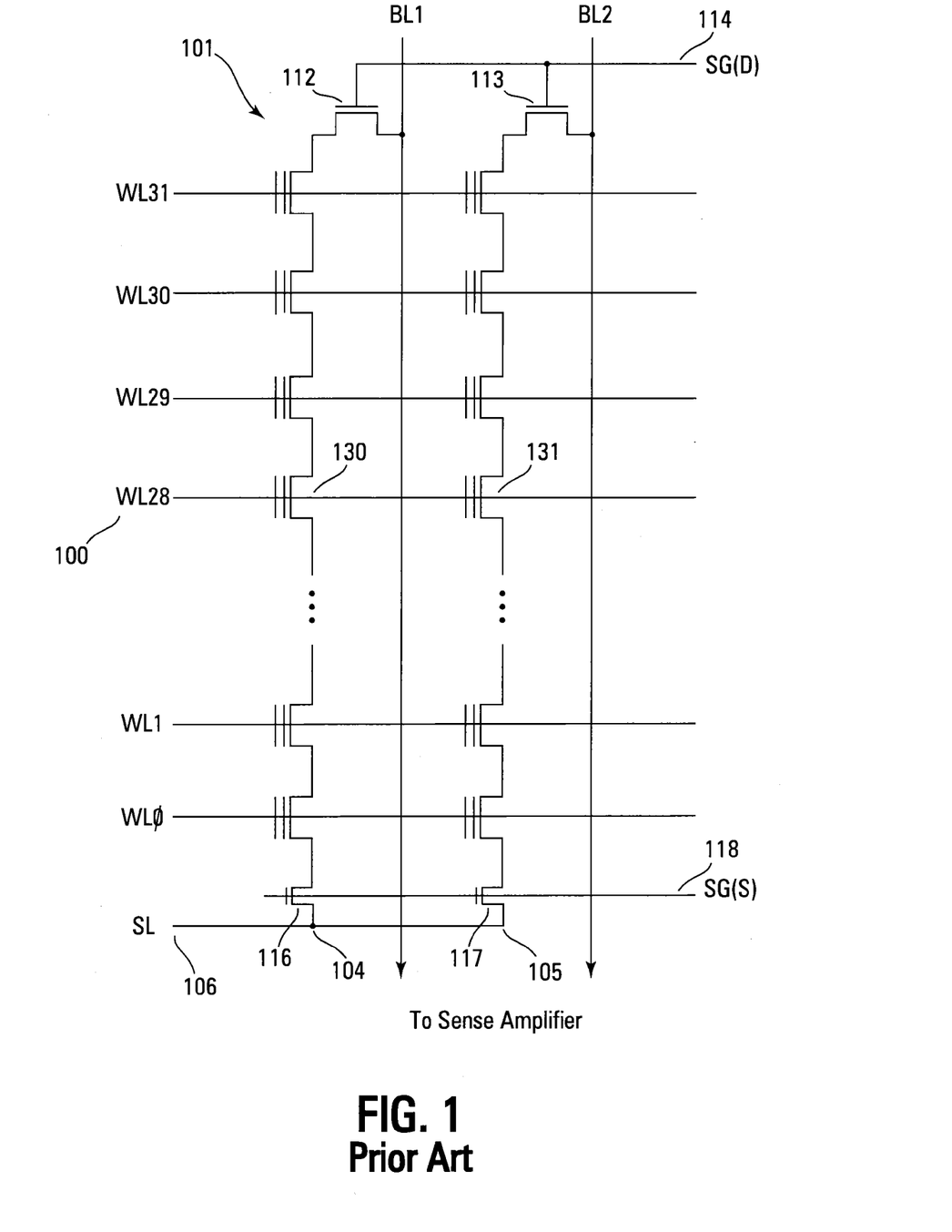
FIG. 1 shows a simplified diagram of a typical prior art NAND flash memory array.

FIG. 1 illustrates a simplified diagram of a typical NAND flash memory array. The memory array of FIG. 1, for purposes of clarity, does not show all of the elements typically required in a memory array. For example, only two bit lines are shown (BL1 and BL2) when the number of bit lines required actually depends upon the memory density.

The array is comprised of an array of floating gate cells 101 arranged in series strings 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. The bit lines BL1, BL2 are eventually coupled to sense amplifiers (not shown) that detect the state of each cell. Each series string 104, 105 of floating gate memory cells is coupled to a source line 106 by a source select gate 116, 117 and to an individual bit line (BL1, BL2) by a drain select gate 112, 113. The source select gates 116, 117 are controlled by a source select gate control line SG(S) 118 coupled to their control gates. The drain select gates 112, 113 are controlled by a drain select gate control line SG(D) 114.

Each cell can be programmed as a single bit per cell (i.e., single level cell-SLC) or multiple bits per cell (i.e., multilevel cell-MLC). Each cell's threshold voltage ($V_{th}$) determines the data that is stored in the cell. For example, in a single bit per cell, a $V_{th}$ of 0.5V might indicate a programmed cell while a $V_{th}$ of −0.5V might indicate an erased cell. The multilevel cell has multiple $V_{th}$ distributions that each indicates a different state. Multilevel cells take advantage of the analog nature of a traditional flash cell by assigning a bit pattern to a specific voltage range stored on the cell. The distributions are separated by a voltage space or margin that is relatively small due to the limitations of fitting four states into a low voltage memory device.

When programming the above-described cells, they start from an erased state. During the erased state, the non-volatile memory cells draw current. Even after one program pulse, most of the memory cells are not programmed, thus resulting in a "source line bounce" or source line noise where the source line is higher than normal due to the remaining erased cell current usage. When the source line is higher than the body voltage of a memory cell, the threshold voltage for that cell is going to be higher as well. This result of source line bounce is illustrated in FIG. 2.

Figure 2:
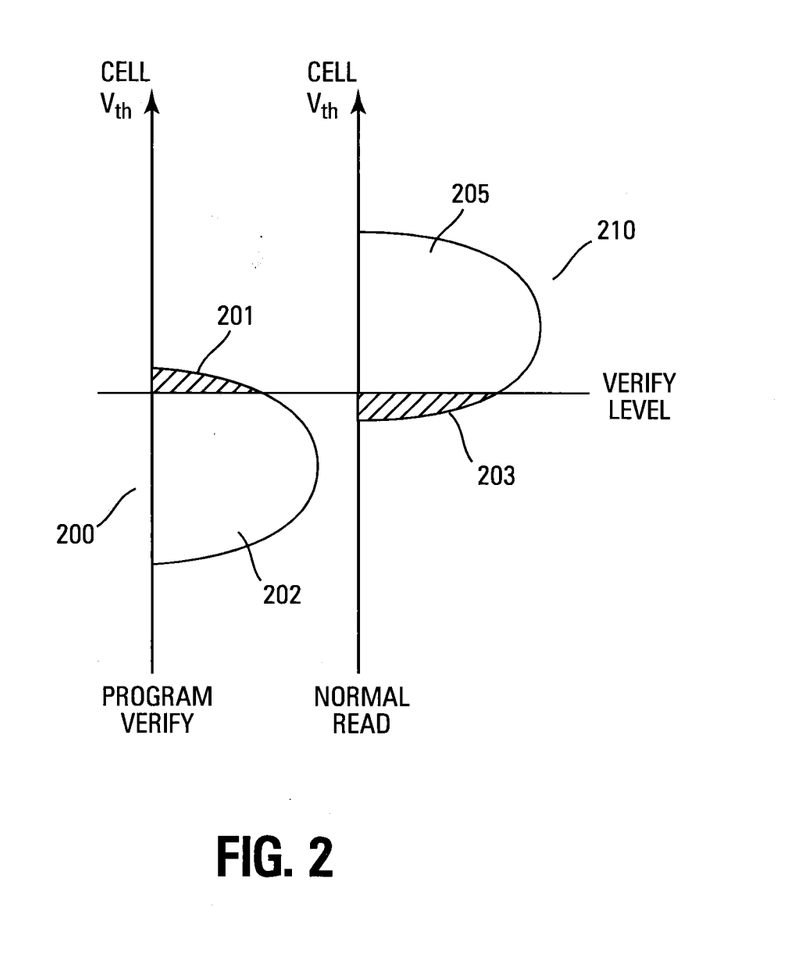
FIG. 2 shows a typical threshold voltage distribution of a single level cell for program verify and normal read.

The left side of FIG. 2 illustrates a program verify operation after one programming pulse. The right side of FIG. 2 illustrates a normal read operation after the programming operation is complete, resulting in a successful verify operation. The left side shows the threshold voltage distribution 200 for a string of memory cells after one programming pulse. During a program verify operation, the memory cells 201 above the verify level are considered to be programmed while the memory cells 202 below the verify level are underprogrammed. During this program verify operation, the source line is substantially higher than normal due to the source line bounce.

The right side of FIG. 2 shows the threshold voltage distribution 210 after the program operation has been completed. This distribution 210 occurs during a normal read operation and shows that most memory cells are now programmed 205 while some are still below the verify level and are read as being under-programmed 203. This is due to the fact that, since the majority of the cells in the string are now programmed, the source line bounce is negligible during the normal read operation. Without the source line bounce, the extra boost to the threshold voltages has been removed and these voltages are now more normal.

The above-mentioned factors can result in overlapping of threshold distributions in memory devices that have a narrow margin between states, such as in MLC devices. Source line bounce or noise can be a factor in SLC memory as well resulting in some memory cells being program verified below the verify level so that they are read as a logical 1 (i.e., erased) instead of a logical 0 (i.e., programmed).

For the reasons stated above, and for other reasons stated below which will become apparent to those skilled in the art upon reading and understanding the present specification, there is a need in the art for tighter control of threshold voltage distributions in memory devices.

DETAILED DESCRIPTION

In the following detailed description, reference is made to the accompanying drawings that form a part hereof and in which is shown, by way of illustration, specific embodiments. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
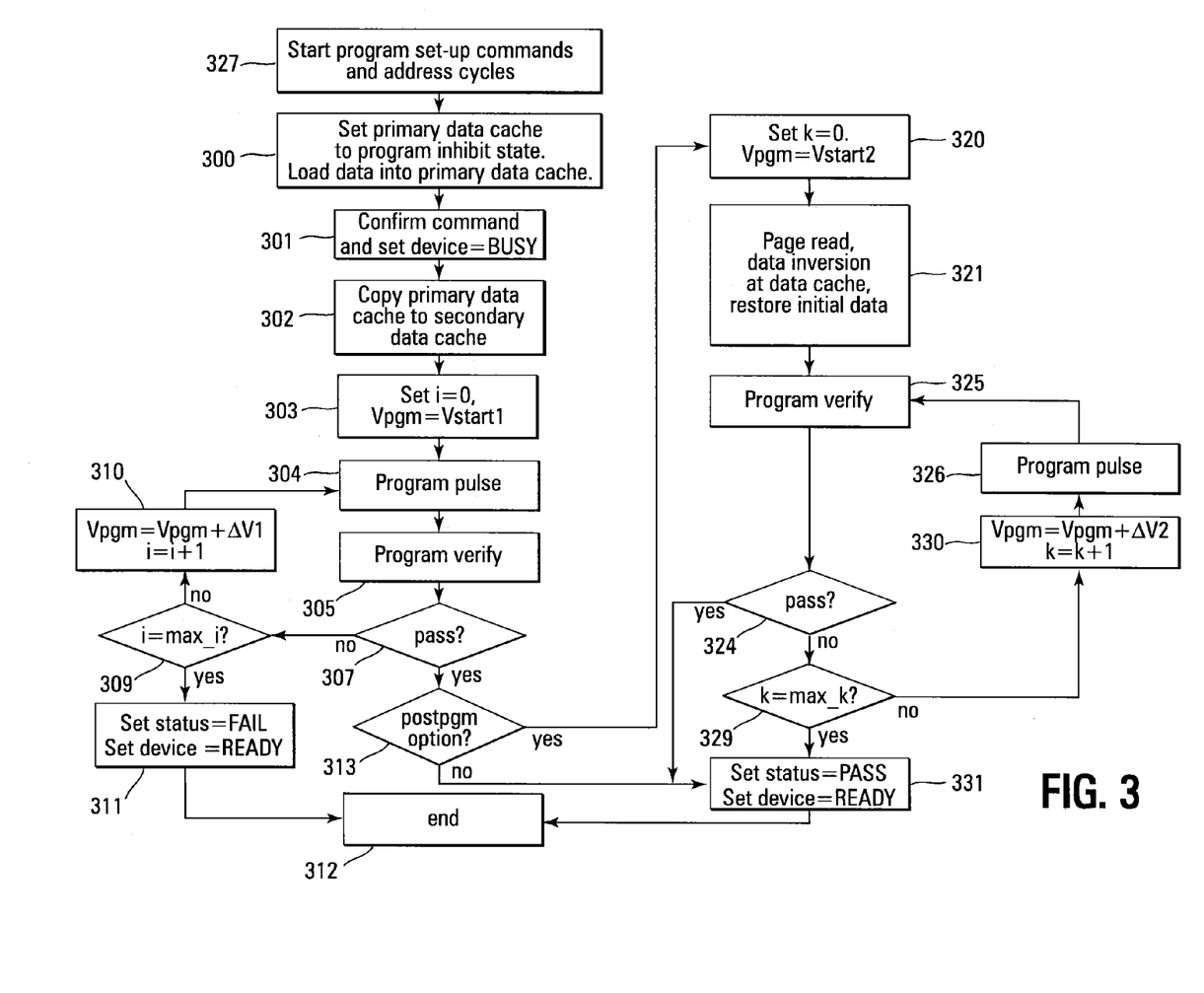
FIG. 3 shows a flowchart of one embodiment of a method for programming a non-volatile memory device.

FIG. 3 illustrates a flowchart of one embodiment of a method for programming a non-volatile memory device. The programming operation starts 327 by initiating program set-up commands and address cycles. A primary data cache is set as being program inhibited and programming the primary data cache with the data to be programmed 300. The reason for inhibiting programming prior to the data load is for a partial programming embodiment. In such an embodiment, the device should not program the cell for which data is not loaded. The primary data cache circuit is discussed subsequently in greater detail with reference to FIGS. 4 and 5. In one embodiment, the primary data cache and a secondary data cache are coupled to every two bit lines in the form of a page buffer 402 (see FIG. 4).

The received command is confirmed as being a program command and the memory device is set as being busy 301. The primary data cache is then copied to the secondary data cache 302.

A programming pulse counter is set to 0 (i.e., i=0) and a program voltage to an initial voltage (i.e., $V_{pgm}=V_{start1}$) 303. For purposes of illustration, $V_{start1}$ is 16 V. The initial program pulse is then issued 304 to the word line of the cells to be programmed.

A program verify operation 305 is then performed to determine if the cells have been programmed. This is accomplished by comparing 307 the threshold voltage of the cells being programmed with a verify voltage threshold level. Any cells having a threshold voltage above this level have been programmed. Cells with threshold voltages below this level are underprogrammed.

If the cells are still underprogrammed, it is then determined if the cells have been subjected to the maximum quantity of programming pulses 309 that are allowed in a particular embodiment. This is accomplished by comparing the program pulse counter to a maximum program pulse count, max_i 309. If the threshold for maximum quantity of programming pulses has been reached, the cell has failed programming, the device status is set as "failed" the device is set as "ready" 311, and the programming operation is over 312. If the threshold for maximum quantity of programming pulses has not been reached, the programming voltage $V_{pgm}$ is increased by a predetermined step voltage $\Delta V_1$ (i.e., $V_{pgm}=V_{pgm}+\Delta V_1$) and the program pulse counter is incremented (i.e., i=i+1) 310. This program pulse/verify operation is repeated until either the maximum quantity of pulses are reached 309 or the program verify operation passes 307.

Once the program verify operation passes 307, every primary data cache is now in a program inhibited state to prevent further programming on the bit line coupled to the cell being programmed. It is then determined whether a post-programming operation is to be performed 313. For example, the post-programming operation may be skipped to speed up the programming operation. If the post-programming operation is to be performed, the initial program data needs to be restored and the underprogrammed data bits collected by performing the verify operation. It should be noted that, in one embodiment an under-programmed data bit is not considered an erased cell. In order to accomplish these tasks, another programming pulse counter, k, is initialized to 0 and the initial programming pulse is set to an initial programming voltage (i.e., $V_{pgm}=V_{start2}$) 320. In one embodiment, the initial programming voltage for the post-programming operation starts at the same voltage as the first programming operation.

Figure 4:
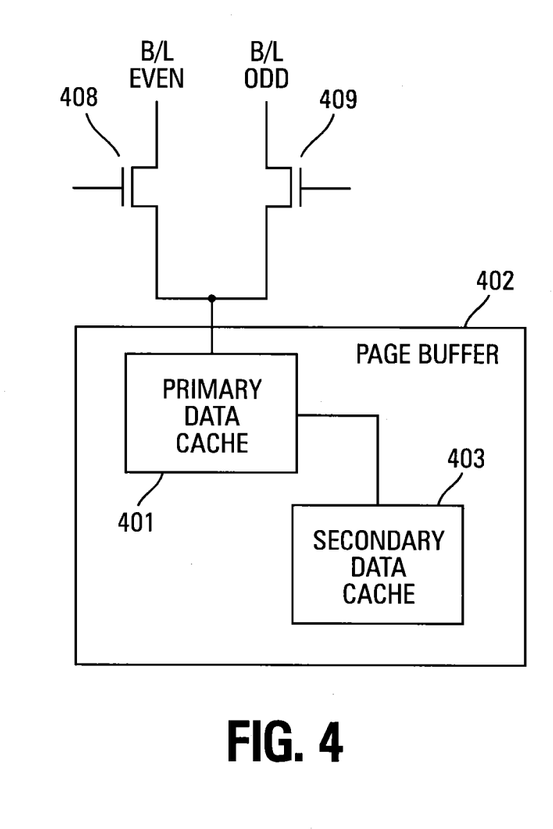
FIG. 4 shows a block diagram of one embodiment of a data cache.

A page read operation is then performed, the initial data is restored to the secondary data cache and, if necessary, a data inversion is performed at the secondary data cache 321. This operation 321 is accomplished using the page buffer circuit 402 as illustrated in FIG. 4. In an alternate embodiment, the programmed memory cells can be read for the sensed data so that an extra (secondary) data cache may not be required.

FIG. 4 illustrates a page buffer 402 comprising a primary data cache 401 and a secondary data cache 403. The primary data cache 401 is configured to store a data bit that indicates whether a successful programming operation has been achieved. The secondary data cache 403 stores the data bit that is being programmed into a cell that is currently coupled to the page buffer 402. This circuit is coupled to bit lines through select gate transistors 408, 409. One transistor 408 couples the circuit to an even bit line and the other transistor 409 couples the circuit to an odd bit line. Only one select transistor 408, 409 is turned on at any one time so that the circuit is coupled to either the even or odd bit line while being isolated from the other bit line.

In operation, before the programming operation begins, the program data is copied to the secondary (dynamic) data cache 403 from the primary data cache 401. This is to store the original data for the post program operation. Then the primary data cache 401, that contains the data to be programmed, provides the appropriate bit line bias voltage for the programming through the select transistor 408 or 409. When the memory cells have been successfully programmed and verified, the primary data cache 401 flips to a program-inhibited state to indicate the successful program operation. Referring again to the method of FIG. 3, the data inversion 321 is performed after the page read from the secondary data cache 403 to restore the originally programmed data. Once the data inversion is performed on the secondary data cache 403, the state of the primary data cache 401 is not changed back again until the next programming operation. One example of the data inversion step is illustrated subsequently with reference to FIG. 5. In an alternate embodiment, the data inversion may not be necessary.

FIG. 3 next illustrates that a program verify operation 325 is performed in order to determine if any under-programmed cells exist under the lower source line bounce condition. The verify operation 325 is done at the same verify level as the previous verify. However, now that the source line bounce has been substantially reduced due to programming of the cells, this verify operation 325 will actually be at a different level. If the verification operation passes 324, no under-programmed cells were found and the additional program pulses are not required. In this case, the status of the verify operation is set as a "pass" and the memory device is set as "ready" 331. Otherwise, another program pulse is necessary to tighten the threshold voltage distribution.

To accomplish this, it is then determined if the maximum programming pulse threshold has been reached 329. This threshold is set to 2 pulses (k=1) but can be other programming pulse quantities. If the maximum threshold is reached, status is set to "pass" 331 and the programming operation is over. Otherwise, counter k is incremented by one and the programming voltage, $V_{pgm}$ is incremented by a predetermined step voltage, $\Delta V_2$ 330. This step voltage can be the same as $\Delta V_1$ or some other step voltage.

The program pulse is at $V_{start2}$ that, in one embodiment, is the same as $V_{start1}$. However, alternate embodiments can use a different $V_{start2}$. After the program pulse 326, the verify operation 325 is repeated and the pulse counter, k, is compared to the maximum threshold for secondary programming pulses (i.e., max_k) 329.

The post-programming operation is repeated from the program verify operation 325 until the operation passes or the maximum program pulse threshold has been reached. The operation then ends 312.

Figure 5:
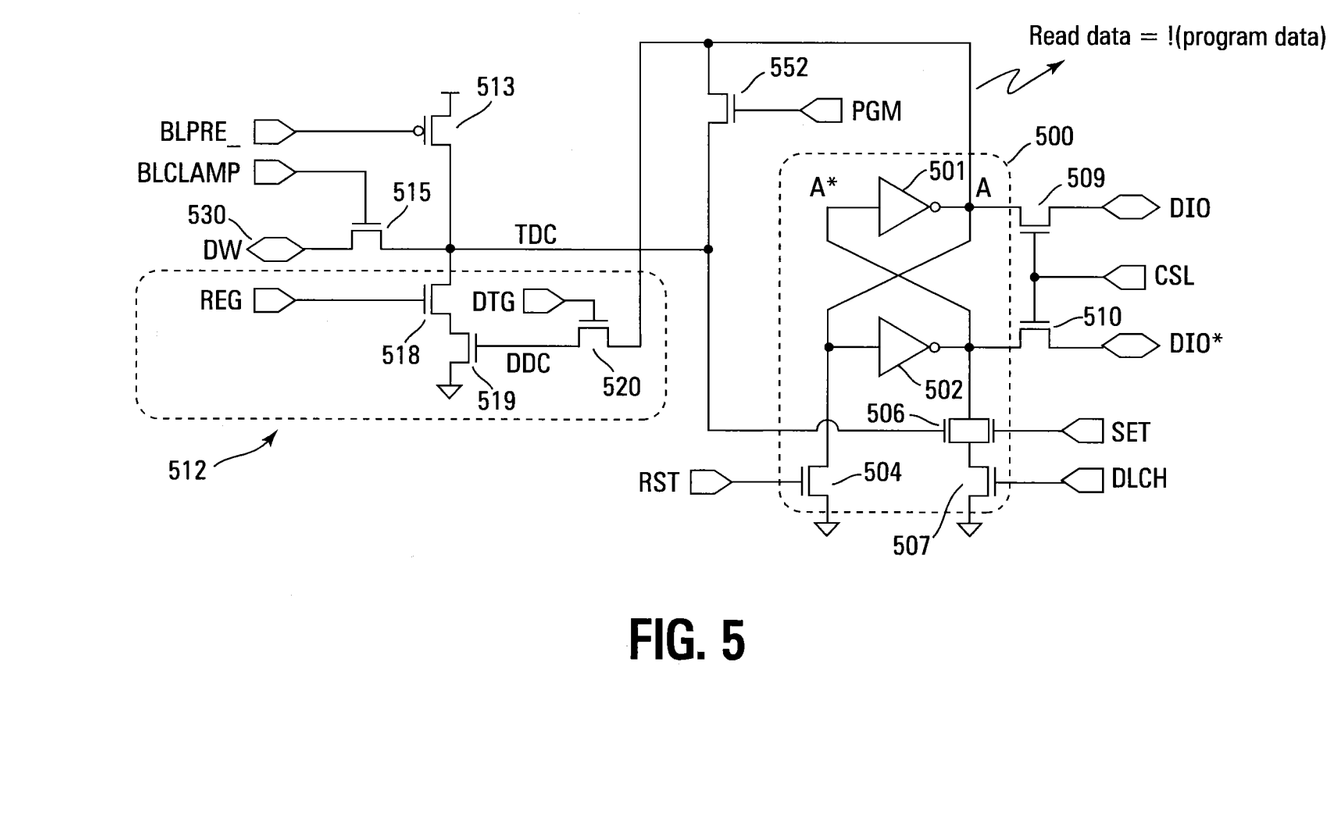
FIG. 5 shows a schematic diagram of one embodiment of a data cache in accordance with the block diagram of FIG. 4.

FIG. 5 shows a schematic diagram of one embodiment for implementing the cache register/data cache of FIG. 4. This schematic is for purposes of illustration only as the block diagram of FIG. 4 can be implemented using different circuits.

The circuit is comprised of a static latch 500 that outputs a data I/O (DIO) through a first control transistor 510 and an inverse data I/O (DIO*) through a second control transistor 509. The static cache register 500 is coupled to the odd and even bit lines as shown in FIG. 4 through a 2:1 multiplexer through the DW connection 530. This causes programming on the bit line to be inhibited when the register is set from a logic zero to a logic one.

The static cache register 500 is comprised of two inverters 501, 502 that are coupled to the DIO and DIO* outputs. A reset signal RST is coupled to control a reset transistor 504 to set the latch to its logical zero state. A set signal SET is coupled to a transfer gate 506 to set the latch to its logical one state through a control transistor 507 that is controlled by a data latch signal DLCH.

The circuit of FIG. 5 also has a dynamic data cache 512 that is comprised of three transistors 518-520. This circuit is controlled by a data store control signal, DTG, that is comprised of $V_{cc}+V_{tn}$ where $V_{tn}$ is the NMOS transistor threshold voltage. This voltage is required due to the need to bias the NMOS gate with a voltage above $V_{cc}+V_{tn}$ in order to pass the full $V_{cc}$ voltage through the transistor. A register control signal REG enables the dynamic data cache 512.

In operation, the cache register circuit of FIG. 5 is first put into a program inhibit state before data is loaded. By enabling the SET signal and the DLCH signal to turn on their respective transistors 506, 507, A/A* are set to the 0/1 state.

Data is then programmed into the cache register 500 through the DIO/DIO* lines by enabling the CSL signal to turn on the two transistors 509, 510. CSL is a decoded signal for a selected data byte as the column address is increased. Data is programmed such that DIO is a logical 1, DIO* is a logical 0, A* is a logical 1, A is a logical 0, and DDC is in a do not care state.

The original data to be programmed is stored into the dynamic data cache 512 by enabling the DTG signal. This is done prior to the first program pulse as seen in the flowchart of FIG. 3.

During a programming operation, the PGM signal is enabled to turn on its respective transistor 552. BLCLAMP is also enabled to turn on its respective transistor 515 as well. The data in A* can then be transferred to the DW connection 530 that is coupled to the odd/even bit lines.

During a program verify operation, the DW connection 530 remains at the bit line precharge level if the cell is programmed (i.e., a zero state). Otherwise, the DW line will be discharged. As a result, TDC will be at a logical one state when the cell programming is complete (cell is off) and a logical 0 state when the cell programming is incomplete (cell is on) or the cell is program inhibited.

When DLCH is enabled high, data is latched into the cache register. When the memory cell has been successfully programmed, A* goes from the logic one state to the logic zero state and A goes from the logic zero state to the logic one state. Programming of this latch is now inhibited so that A/A* stay at their current state.

When the original data is read from the dynamic data cache 512, the RST signal is enabled to set A to a logic one state and A* to a logic zero state. The TDC line is precharged by enabling BLPRE* to a logic zero. This turns on the transistor 513 to pull up TDC to $V_{cc}$. Data is then transferred from the dynamic data latch 512 to TDC by enabling the REG connection to a logic one to turn on the transistor 518. If DDC is high, TDC is a logic zero, otherwise, TDC is one. Data is transferred from TDC to A/A* by enabling DLCH to turn on its respective transistor 507. As a result, DDC goes from one to zero, TDC goes from zero to one, and A/A* are now 1/0. Note that DDC equal to one is a program inhibit state. A* equal to zero is programmed data state and the data polarity is inverse. Therefore, data inversion is necessary for this embodiment.

Data inversion is accomplished by transferring data from A to DDC through the DTG transistor 520. TDC is precharged to a logic one state through the BLPRE* transistor 513. Data is then transferred from DDC to TDC. A is reset to the logic zero state through the RST transistor 504. A* now is a logic one and A is a logic zero. Data is transferred from TDC to A* and A through the DLCH transistor 507.

In an alternate embodiment, the original program data can be stored into DDC. The data can then be read not from DDC but from the memory array.

The configurations of FIGS. 4 and 5 are for purposes of illustration only. The original data can be stored in other locations such as in the memory array itself. Additionally, the function provided by the circuit can be implemented in other circuits than the one shown.

Figure 6:
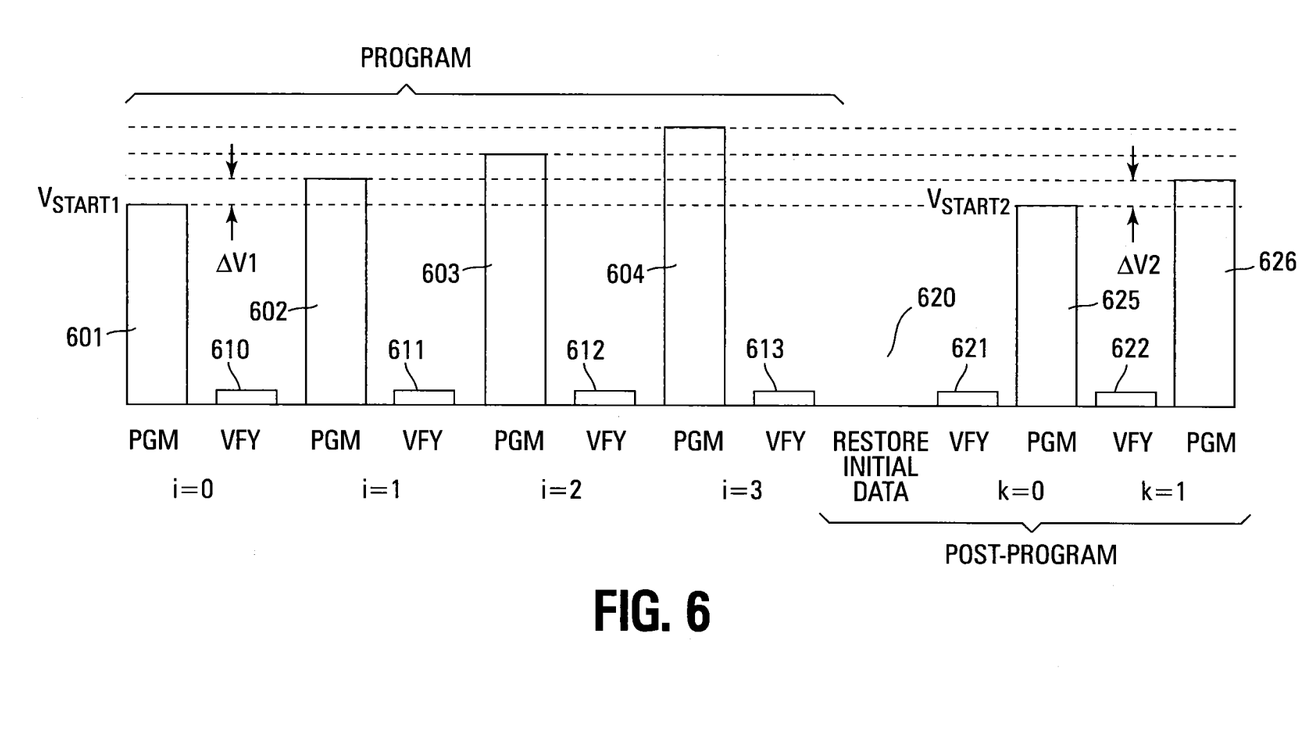
FIG. 6 shows a signal waveform in accordance with the method of FIG. 2.

FIG. 6 illustrates a signal waveform in accordance with the method of FIG. 3. The first set of program 601-604 and verify 610-613 pulses are part of the initial programming operation. The program pulses 601-604 start at $V_{pgm}=V_{start1}$ and increment by $\Delta V_1$. The second set of program 625, 626 and verify 621, 622 pulses are part of the post-program operation. These program pulses start at $V_{pgm}=V_{start2}$ and increment by $\Delta V_2$. The restore initial data operation 620, as described previously, is performed with a word line bias of 0V. The quantity of program/verify pulses for both the initial program operation and the post-program operation is for purposes of illustration only since the actual quantity depends on the programming speed of each individual memory cell of the memory array.

Figure 7:
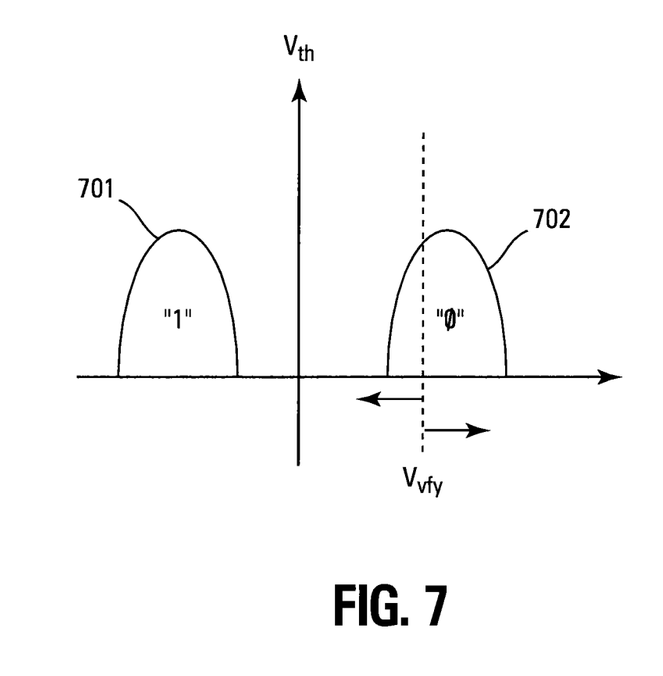
FIG. 7 shows a threshold distribution for a single level cell with a verify voltage threshold.

FIG. 7 illustrates a threshold distribution for an SLC memory device. This figure shows why the originally programmed data is read after the initial programming operation.

The two states are shown as the erased state 701 and the programmed state 702. The voltage at which the programmed cells are verified is shown as $V_{vfy}$. The memory cells with a threshold voltage that are sensed to the right of $V_{vfy}$ are read as a programmed logical zero state. The cells that are sensed at a threshold voltage that is less than $V_{vfy}$ are underprogrammed and thus sensed as a logical one state.

However, it is unknown whether the sensed data is due to a properly programmed memory cell or an underprogrammed cell. Therefore, the original data is read and compared to what was sensed. If the data do not match, the cell has been underprogrammed and the post-programming operation is necessary.

Figure 8:
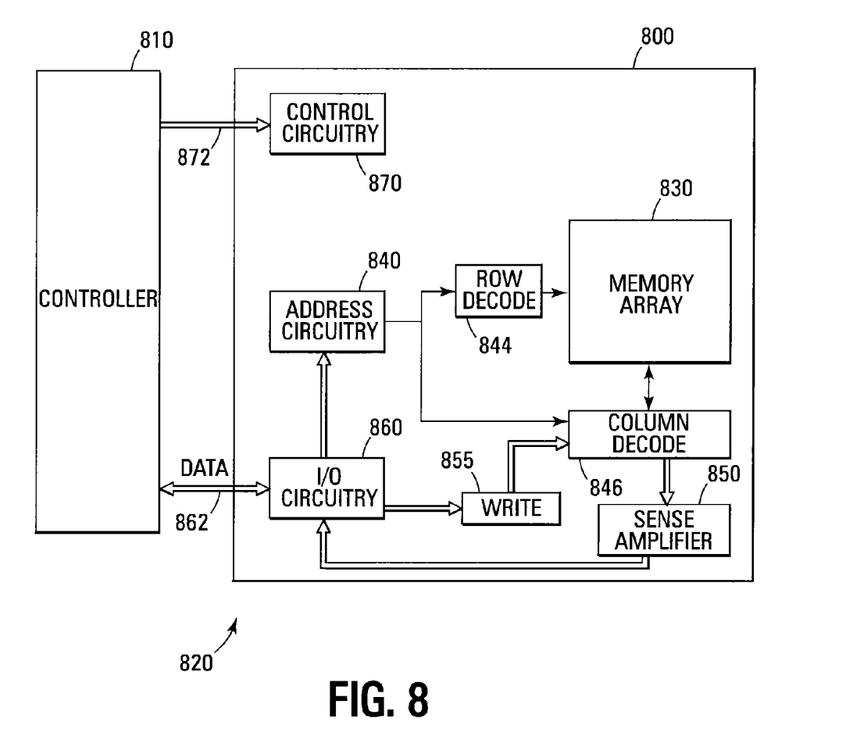
FIG. 8 shows a block diagram of one embodiment of a memory system.

FIG. 8 illustrates a functional block diagram of a memory device 800 that can incorporate the embodiments for non-volatile memory programming as previously described. The memory device 800 is coupled to a controller device 810. The controller device 810 may be a microprocessor, a memory controller, or some other type of controlling circuitry. The memory device 800 and the processor 810 form part of a memory system 820. The memory device 800 has been simplified to focus on features of the memory that are helpful in understanding the present invention.

The memory device includes an array of memory cells 830 that can include flash memory cells or some other type of non-volatile memory cells. The memory array 830 is arranged in banks of rows and columns. The control gates of each row of memory cells is coupled to a wordline while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense amplifier/buffer circuitry 850. The sense amplifier/buffer circuitry, in one embodiment, is coupled to read and latch a row of data from the memory array 830. Data input and output buffer circuitry 860 is included for bi-directional data communication over a plurality of data connections 862 with the controller 810. Write circuitry 855 is provided to write data to the memory array.

Control circuitry 870 decodes signals provided on control connections 872 from the processor 810. These signals are used to control the operations on the memory array 830, including data read, data write, and erase operations. The control circuitry 870 may be a state machine, a sequencer, or some other type of controller. In one embodiment, the control circuitry 870 executes the programming embodiments previously described.

The memory device illustrated in FIG. 8 has been simplified to facilitate a basic understanding of the features of the memory and is for purposes of illustration only. A more detailed understanding of internal circuitry and functions of memories are known to those skilled in the art. Alternate embodiments may include a memory cell of one embodiment of the present invention in other types of electronic systems.

Figure 9:
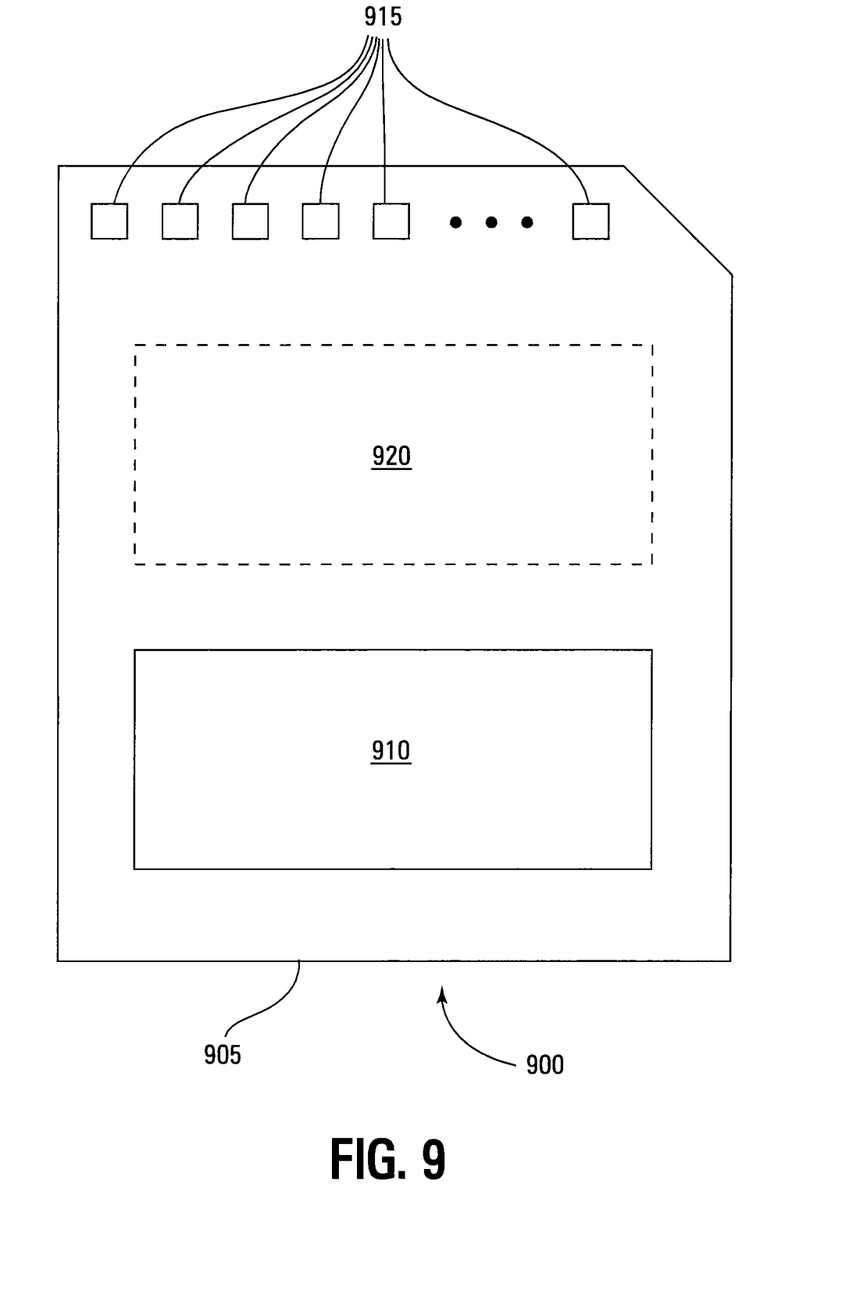
FIG. 9 shows a block diagram of one embodiment of a memory module incorporating the programming embodiments.

FIG. 9 is an illustration of a memory module 900 that incorporates the temperature compensation embodiments as discussed previously. Although the memory module 900 is illustrated as a memory card, the concepts discussed with reference to the memory module 900 are applicable to other types of removable or portable memory, e.g., USB flash drives. In addition, although one example form factor is depicted in FIG. 9, these concepts are applicable to other form factors as well.

The memory module 900 includes a housing 905 to enclose one or more memory devices 910 of the present invention. The housing 905 includes one or more contacts 915 for communication with a host device. Examples of host devices include digital cameras, digital recording and playback devices, PDAs, personal computers, memory card readers, interface hubs and the like. For some embodiment, the contacts 915 are in the form of a standardized interface. For example, with a USB flash drive, the contacts 915 might be in the form of a USB Type-A male connector. In general, however, contacts 915 provide an interface for passing control, address and/or data signals between the memory module 900 and a host having compatible receptors for the contacts 915.

The memory module 900 may optionally include additional circuitry 920. For some embodiments, the additional circuitry 920 may include a memory controller for controlling access across multiple memory devices 910 and/or for providing a translation layer between an external host and a memory device 910. For example, there may not be a one-to-one correspondence between the number of contacts 915 and a number of I/O connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is required for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910. The additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

In summary, the embodiments discussed herein reduce the problems caused by source line bounce associated with underprogrammed memory cells during a verify operation. A post-programming operation provides additional programming after underprogrammed cells have been identified.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof

What is claimed is:

1. A memory module comprising:
   at least two non-volatile memory devices, each device comprising:
   a memory array having a plurality of non-volatile memory cells coupled to word lines and bit lines;
   a plurality of cache registers for inhibiting programming of a column of memory cells, each cache register coupled to a pair of bit lines;
   a plurality of data caches for storing data to be programmed, each data cache coupled to the pair of bit lines; and
   a memory controller circuit coupled to the memory array, the controller circuit configured to execute a method for programming the plurality of memory cells such that the controller circuit generates a series of program and verify pulses to program original data into a row of memory cells, sets each respective cache register in response to a successful verification, performs a subsequent verification operation to determine verified data, and performs a post-programming program operation on the row of memory cells if the verified data is different from the original data; and
   a plurality of contacts configured to provide selective contact between the memory devices and a host system.

2. The memory module of claim 1, wherein the at least two non-volatile memory devices are flash memory devices arranged in a NAND configuration.

3. The memory module of claim 1, wherein each of the plurality of cache registers is coupled selectively to its corresponding pair of bit lines through a pair of select gate transistors.

4. The memory module of claim 1, wherein each of the plurality of cache registers is configured to be connected to one bit line of the pair of bit lines while being isolated from the remaining bit line of the pair of bit lines during programming of the original data into the row of memory cells.

5. The memory module of claim 4, wherein each of the plurality of data caches is configured to perform a data inversion of the stored data.

6. The memory module of claim 1, wherein each controller circuit is further configured to program the original data into the row of memory cells in response to the original data being loaded into the plurality of cache registers.

7. The memory module of claim 6, wherein each controller circuit is further configured to load the original data from the plurality of cache registers to the plurality of data caches prior to the programming of the original data into the row of memory cells.

8. The memory module of claim 6, wherein each controller circuit is further configured to load the original data from the plurality of data caches to the plurality of cache registers after the successful verification and prior to the post-programming program operation.

9. A memory module comprising:
   a non-volatile memory device, each device comprising:
   a memory array having a plurality of non-volatile memory cells coupled to word lines and bit lines;
   a plurality of cache registers for inhibiting programming of a column of memory cells, each cache register coupled to a pair of bit lines;
   a plurality of data caches for storing data to be programmed, each data cache coupled to the pair of bit lines; and
   a memory controller circuit coupled to the memory array, the controller circuit configured to execute a method for programming the plurality of memory cells such that the controller circuit generates a series of program and verify pulses to program original data into a row of memory cells, sets each respective cache register in response to a successful verification, performs a subsequent verification operation to determine verified data, and performs a post-programming program operation on the row of memory cells if the verified data is different from the original data;
   a housing for enclosing the memory device; and
   a plurality of contacts coupled to the housing and configured to provide selective contact between the memory device and a host system.

10. The memory module of claim 9, wherein a particular cache register of the plurality of cache registers is configured to be connected to one bit line of its corresponding pair of bit lines while being isolated from the remaining bit line of its corresponding pair of bit lines during programming of the original data into the row of memory cells.

11. The memory module of claim 10, wherein the data cache in communication with the particular cache register is configured to perform a data inversion of the stored data prior to the post-programming program operation.

12. The memory module of claim 9, wherein each controller circuit is further configured to program the original data into the row of memory cells in response to the original data being loaded into the plurality of cache registers.

13. The memory module of claim 12, wherein each controller circuit is further configured to invert the original data from the plurality of cache registers and to load the inverted original data to the plurality of data caches prior to the programming of the original data into the row of memory cells.

14. The memory module of claim 12, wherein each controller circuit is further configured to invert the inverted original data from the plurality of data caches and to load the resulting original data to the plurality of cache registers after the successful verification and prior to the post-programming program operation.

15. The module of claim 9 wherein the memory device is a non-volatile USB memory device.

16. The module of claim 9 wherein the non-volatile memory device is a flash memory device.

17. A memory module comprising:
   at least two non-volatile memory devices, each device comprising:
   a memory array having a plurality of non-volatile memory cells coupled to word lines and bit lines;
   a plurality of cache registers for inhibiting programming of a column of memory cells, each cache register coupled to a pair of bit lines;
   a plurality of data caches for storing data to be programmed, each data cache coupled to the pair of bit lines and in communication with a corresponding cache register of the plurality of cache registers; and a memory controller circuit coupled to the memory array, the controller circuit configured to execute a method for programming the plurality of memory cells such that the controller circuit generates a series of program and verify pulses to program original data into a row of memory cells in response to the original data being loaded into the plurality of cache registers, sets each respective cache register to an inhibited state in response to a successful verification of its corresponding memory cell of the row of memory cells, restores the original data to the plurality of cache registers, performs a subsequent verification operation on the row of memory cells to determine verified data, and performs a post-programming program operation on the row of memory cells if the verified data is different from the restored original data in the plurality of cache registers; and a plurality of contacts configured to provide selective contact between the memory devices and a host system.

18. The memory module of claim 17, wherein each controller circuit is further configured to restore the original data to the plurality of cache registers from stored data of the plurality of data caches.

19. The memory module of claim 18, wherein each controller circuit is further configured to invert the stored data of the plurality of data caches to restore the original data to the plurality of cache registers.

20. The memory module of claim 17, wherein each controller circuit is further configured to load the original data from the plurality of cache registers to the plurality of data caches in a format selected from the group consisting of the original data and inverted original data prior to programming the row of memory cells.

* * * * *